United States Patent
Welle et al.

(10) Patent No.: US 11,616,285 B2
(45) Date of Patent: Mar. 28, 2023

(54) MEASURING DEVICE WITH NEAR FIELD ANTENNA

(71) Applicant: VEGA Grieshaber KG, Wolfach (DE)

(72) Inventors: Roland Welle, Hausach (DE); Levin Dieterle, Oberwolfach (DE); Joerg Boersig, Oberwolfach (DE); Steffen Waelde, Niedereschach (DE); Christian Weinzierle, Wolfach (DE)

(73) Assignee: VEGA GRIESHABER KG, Wolfach (DE)

( * ) Notice: Subject to any disclaimer, the term of this patent is extended or adjusted under 35 U.S.C. 154(b) by 198 days.

(21) Appl. No.: 16/942,563

(22) Filed: Jul. 29, 2020

(65) Prior Publication Data
US 2021/0036401 A1    Feb. 4, 2021

(30) Foreign Application Priority Data

Aug. 1, 2019    (DE) .................... 10 2019 211 607.8

(51) Int. Cl.
*H01Q 1/22* (2006.01)
*G01R 29/10* (2006.01)
*H01Q 9/28* (2006.01)
*H01Q 7/00* (2006.01)

(52) U.S. Cl.
CPC ........... *H01Q 1/2208* (2013.01); *G01R 29/10* (2013.01); *H01Q 7/00* (2013.01); *H01Q 9/28* (2013.01)

(58) Field of Classification Search
None
See application file for complete search history.

(56) References Cited

U.S. PATENT DOCUMENTS

| 8,179,266 | B2 | 5/2012 | Hermle | |
| 9,024,725 | B2* | 5/2015 | Ikemoto | H01Q 1/2216 |
| | | | | 455/41.1 |
| 9,819,097 | B2* | 11/2017 | Kerselaers | H01Q 21/0006 |
| 2004/0256468 | A1* | 12/2004 | Akiho | G06K 7/10336 |
| | | | | 235/492 |

(Continued)

FOREIGN PATENT DOCUMENTS

| DE | 10 2006 043 786 A1 | 3/2008 |
| DE | 102011081517 | 2/2013 |

(Continued)

OTHER PUBLICATIONS

Global Sources, https://www.globalsources.com/gsol/desktop/produetExpired.de?category_id=3000000149681&catalogid=2000000003844&query=RFID%20antenna&language=en#1045523377, Retrieved Jan. 12, 2020, 3 sheets.

(Continued)

*Primary Examiner* — Trinh V Dinh
(74) *Attorney, Agent, or Firm* — Fay Kaplun & Marcin, LLP

(57) ABSTRACT

A measuring device which detects a parameter includes at least one communication device which is arranged for wireless short-range communications with a mobile operating device. The communication device includes one or more two-dimensionally formed coil elements arranged for electromagnetic coupling with at least one coil element of the operating device. At least two regions are provided on a coil element or on different coil elements of the communication device, which have a different normal vector.

26 Claims, 3 Drawing Sheets

(56) References Cited

U.S. PATENT DOCUMENTS

| | | | |
|---|---|---|---|
| 2008/0068132 A1 | 3/2008 | Kayanakis et al. | |
| 2014/0184462 A1* | 7/2014 | Yosui | H01Q 7/06 |
| | | | 343/788 |
| 2014/0197930 A1 | 7/2014 | Zenuni et al. | |
| 2017/0005399 A1* | 1/2017 | Ito | H04B 5/0037 |
| 2019/0095600 A1 | 3/2019 | Chan et al. | |
| 2019/0095660 A1 | 3/2019 | Ueno et al. | |

FOREIGN PATENT DOCUMENTS

| | | |
|---|---|---|
| DE | 10 2012 107 291 A1 | 5/2014 |
| EP | 0 928 472 B1 | 2/2006 |
| EP | 3598082 | 1/2020 |

OTHER PUBLICATIONS

Gotrend, http://www.gotrend.com.tw/new?cls=1497838502&id=1497943185, Retrieved Jan. 12, 2020, 1 sheet.

Gotrend, "GTX-SA314 SERIES-V1R2", Retrieved Jan. 12, 2020, 5 sheets.

Smartrac, "UHF RFID Inlay: Frog 3D", Retrieved Jan. 12, 2020, 5 sheets.

Smartrac, "Frog 3D", Retrieved Jan. 12, 2020, 2 sheets.

\* cited by examiner

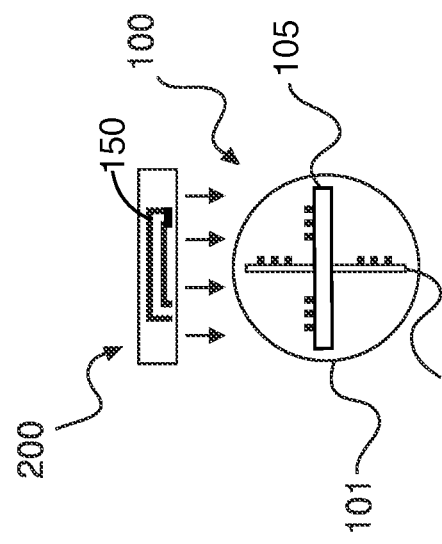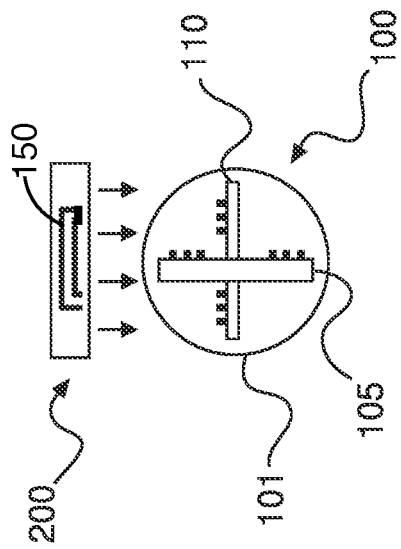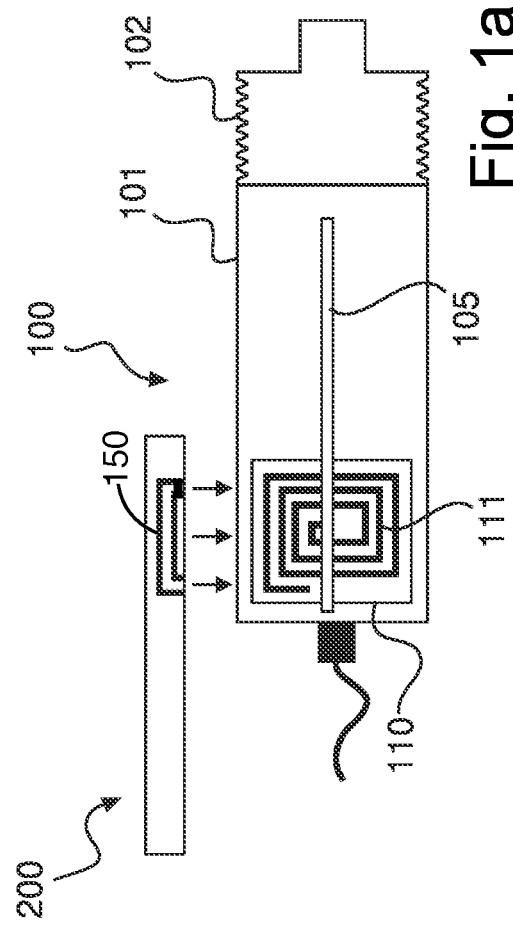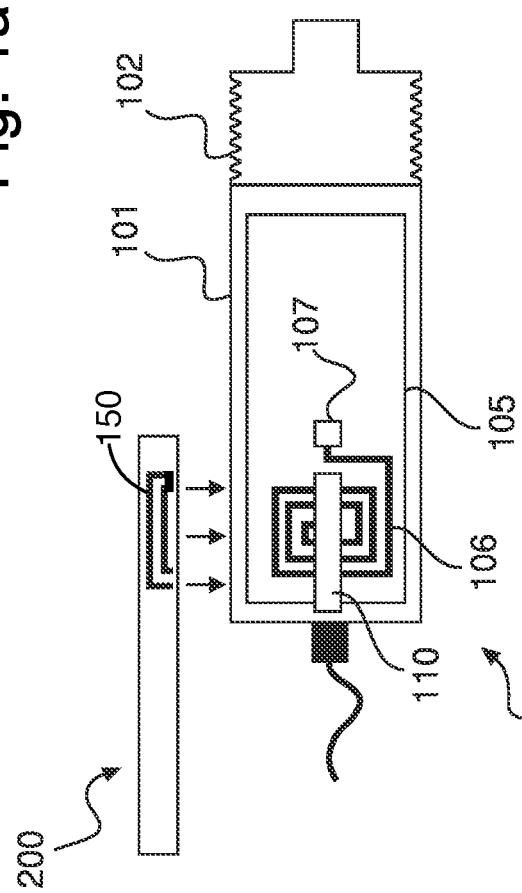

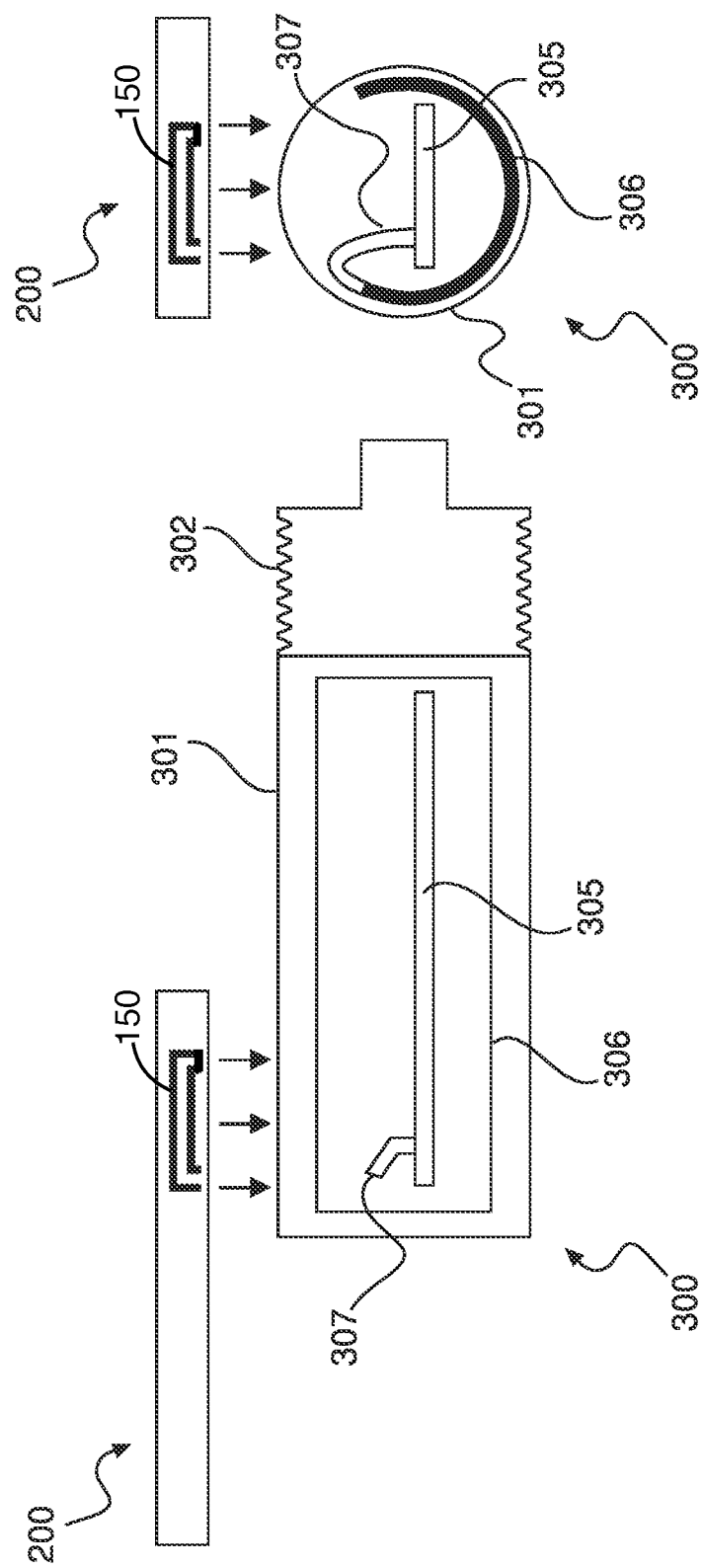

MEASURING DEVICE WITH NEAR FIELD ANTENNA

CROSS-REFERENCE TO RELATED APPLICATIONS

This application claims the benefit of the filing date of German Patent Application Serial No. 10 2019 211 607.8 filed on 1 Aug. 2019 the entire content of which is incorporated herein by reference.

FIELD

The present disclosure relates to a measuring device for measuring a parameter and a system with such a measuring device.

BACKGROUND

Measuring devices/instruments for the measurement of a parameter are known in the prior art and are used in particular in automation technology for a large number of different measuring and monitoring tasks. For example, levels, flows, pressures or densities of media can be detected and monitored with such measuring device. The measuring devices used must first be put into operation and set/calibrated for their specific application conditions and measuring tasks. Usually, such measuring devices are also maintained at regular intervals during operation and their functionality is checked. In this context, modern measuring devices offer a wide range of setting and diagnostic options, whereby mobile control/operating devices such as smartphones, tablets or laptops are increasingly used, which allow access and data exchange with the measuring device via a wireless communication interface. For example, from U.S. Pat. No. 8,179,266 B2, a measuring device is known that allows wireless communication with an operating device via an RFID interface. The measuring device comprises a coil element that can be magnetically coupled with a coil element of the operating device so that a corresponding data exchange can take place. The inductive coupling also makes it possible to transmit the energy required to operate the communication interface, unless this is provided by an energy source provided in the measuring device.

It has now become apparent that there is a further need to further improve or simplify the data exchange between such a measuring device and a mobile operating device. In particular, there is a further need to simplify the inductive coupling between the operating device and the measuring device, as it has been found in practice that this process is comparatively error-prone, especially for measuring devices with an essentially cylindrical housing, and a user often needs several attempts to establish a satisfactory inductive coupling between the two devices.

SUMMARY

The present disclosure relates to a measuring device with which data exchange with a mobile operating device can be simplified. One of advantages of the present disclosure is to simplify data exchange with measuring devices provided with an essentially cylindrical housing.

In particular, the present disclosure relates to a measuring device for detecting at least one parameter to be measured, wherein the measuring device comprises: at least one communication device, arranged for wireless short-range communication with a mobile operating device; wherein the communication device comprises one or more two-dimensional/flat coil elements, arranged for electromagnetic coupling with at least one coil element of the operating device; and wherein at least two areas are provided on a coil element or on different coil elements of the communication device, which have a different normal vector.

The present disclosure is based on the finding that in known measuring devices with a communication device which is based on an inductive coupling of a coil element of a measuring device and a coil element of an operating device, an inductive coupling is maximum when both coil elements are aligned parallel and overlapping to each other. If, on the other hand, the coil elements are arranged orthogonally to one another, no inductive coupling or only very poor inductive coupling can be achieved. In the intermediate ranges, i.e. between a parallel arrangement and an orthogonal arrangement of the coil elements to each other, the coupling quality decreases accordingly. In practice, it has been found that this is particularly problematic for measuring devices with cylindrical housings, since a user cannot always tell from the outside in which position the coil element of the measuring device is arranged after it has been mounted.

The present disclosure relates to providing areas on a coil element or on different coil elements which have different normal vectors. In other words, the present disclosure proposes that areas of a coil element or areas of several coil elements are provided which are arranged in the measuring device in different orientations so that several areas are present which can be aligned in parallel with a coil element of an operating device. Thus, an optimum inductive coupling can be provided not only in one direction but in at least two directions, so that an inductive coupling of an operating device and a measuring device can be provided more easily by an operator.

The term area is to be understood broadly and includes not only planar/flat surfaces provided on one or more coil elements, but also in particular curved, angled or wound surfaces provided on one or more coil elements, as long as this provides at least two areas with different normal vectors, i.e. with different orientations. The term measuring device is also to be understood broadly in this context and includes all units, such as sensors, field devices and the like, with which measured parameters can be acquired and which are set up to carry out an exchange of data and/or energy with a mobile operating device by means of an inductive coupling of coil elements. Close-range communication in the present case is preferably understood to be a so-called "close coupling" or a "remote coupling", which can be provided, for example, by means of RFID interfaces or NFC interfaces, which are used in particular preference in the present context. The term "short-range communication" covers ranges of up to several meters. Access from greater distances should not be provided for security reasons.

Preferably, the measuring device comprises a housing with at least one cylindrical section, whereby at least one coil element is preferably arranged on or in the cylindrical section of the housing. However, a housing of a measuring device may have different geometrical shapes, whereby the present disclosure can be used particularly advantageously in the case of essentially cylindrical housings. This is because measuring devices are often arranged at the place of installation by means of a threaded section provided on the housing, so that the final orientation of the measuring device and thus of the communication device cannot be exactly predetermined and it is subsequently not clearly recognizable to the operator from the outside how the communication device is arranged in the measuring device.

Preferably at least one coil element is arranged on a separate printed circuit board element. The coil element can, for example, be part of an RFID module or an NFC module that is designed as a printed circuit board (PCB) component. Alternatively or additionally, at least one coil element can be designed as separate component and be electrically connected to a printed circuit board element arranged in the housing, preferably two coil elements being designed as separate components which are preferably connected to a printed circuit board element, it also possible to connect each coil element to a separate printed circuit board element. In other words, the present disclosure comprises embodiments in which the coil element(s) is/are fixedly arranged on a printed circuit board element and embodiments in which the coil elements are arranged as separate components and are electrically contacted with a printed circuit board element, wherein one associated printed circuit board element can be provided per coil element or only one printed circuit board element can be provided for several coil elements. The electronic components necessary for communication can be arranged on the circuit board elements, as well as further electronic components which are necessary for the respective measuring task of the measuring device. Components for power supply/transmission can also be provided on or at a printed circuit board element. In this context it should be noted that the present disclosure comprises both active and passive communication devices, i.e. communication devices with or without power supply.

Preferably, the communication device comprises two coil elements, each of which is arranged in a plane and whose normal vectors are arranged at an angle between 15° and 165°, preferably between 45° and 135° and particularly preferably at an angle of 90° to each other, the coil elements preferably being arranged on respective printed circuit board elements. In this context, it is particularly preferred that two printed circuit board elements arranged orthogonally to one another with coil elements each arranged thereon are arranged in a cylindrical housing section of the measuring device, so that a good inductive coupling with a mobile operating device can be achieved in a comparatively large area around the measuring device.

Alternatively or additionally, it is preferred that the communication device comprises at least one coil element with a curved surface, the curved surface preferably corresponding to a partial surface of a cylindrical housing section. In such an implementation it is particularly preferred that the coil element is designed as a separate component and is connected to a corresponding printed circuit board element arranged in the housing. For example, such a coil element can be applied to an inner or outer surface of the housing. Such a coil element can, for example, be designed as a foil element that can be glued to an inner or outer surface of the housing. It is also possible to apply two or more coil elements to an inner or outer surface of the housing. The use of two or more coil elements can provide a certain degree of redundancy, since if one of the coil elements fails, at least communication with the other coil elements can still take place. The design of the coil elements as foil elements is particularly preferred, since these can be arranged comparatively easily in or on a housing during the manufacture of a measuring device and can also cover a comparatively large area of the housing without taking up much installation space.

Furthermore, it is possible to print at least one coil element or its windings/coils on an inner or outer surface of the housing. This also allows the housing surface to be used to accommodate one or more coil elements and the coil elements used can be provided without requiring a large amount of installation space.

Furthermore, a coil element can also be integrally accommodated within a wall of the housing, the wall preferably being formed at least partially from a non-metallic material, in particular a plastic material. Such an implementation form can be provided by a multi-stage injection molding process or by a 2-component injection molding process, for example. A non-metallic material is preferably used on the measuring device at least where an unimpeded inductive coupling with a mobile operating device is to be provided. It is particularly preferred that the housing is made of a plastic material except for a threaded section, so that the largest possible area can be provided in which a good inductive coupling with a mobile operating device is possible. However, the present disclosure is not limited to the use of such a housing. Furthermore, it is possible to arrange coil elements also on a metallic housing section and to provide a non-conductive material, for example a foil, between the housing and the coil element in order to isolate the coil element from the housing.

Finally, there is the possibility of arranging at least one coil element on or in a lid element so that inductive coupling with a mobile operating device can also be made possible on a lid element. This makes it possible to further increase the area in which good inductive coupling can be provided and, for example, to permit inductive coupling transverse to a longitudinal extension of the measuring device.

Furthermore, the present disclosure relates to a system for the detection of a parameter comprising: at least one measuring device described above and at least one mobile operating device, equipped for electromagnetic coupling with at least one coil element of the measuring device.

BRIEF DESCRIPTION OF DRAWINGS

FIGS. 1a, 1b, 1c, and 1d show several schematic views of a first preferred embodiment of a measuring device according to the present disclosure;

FIGS. 2a and 2b show two schematic views of a second preferred embodiment of a measuring device according to the present disclosure.

DETAILED DESCRIPTION

Figure 3:
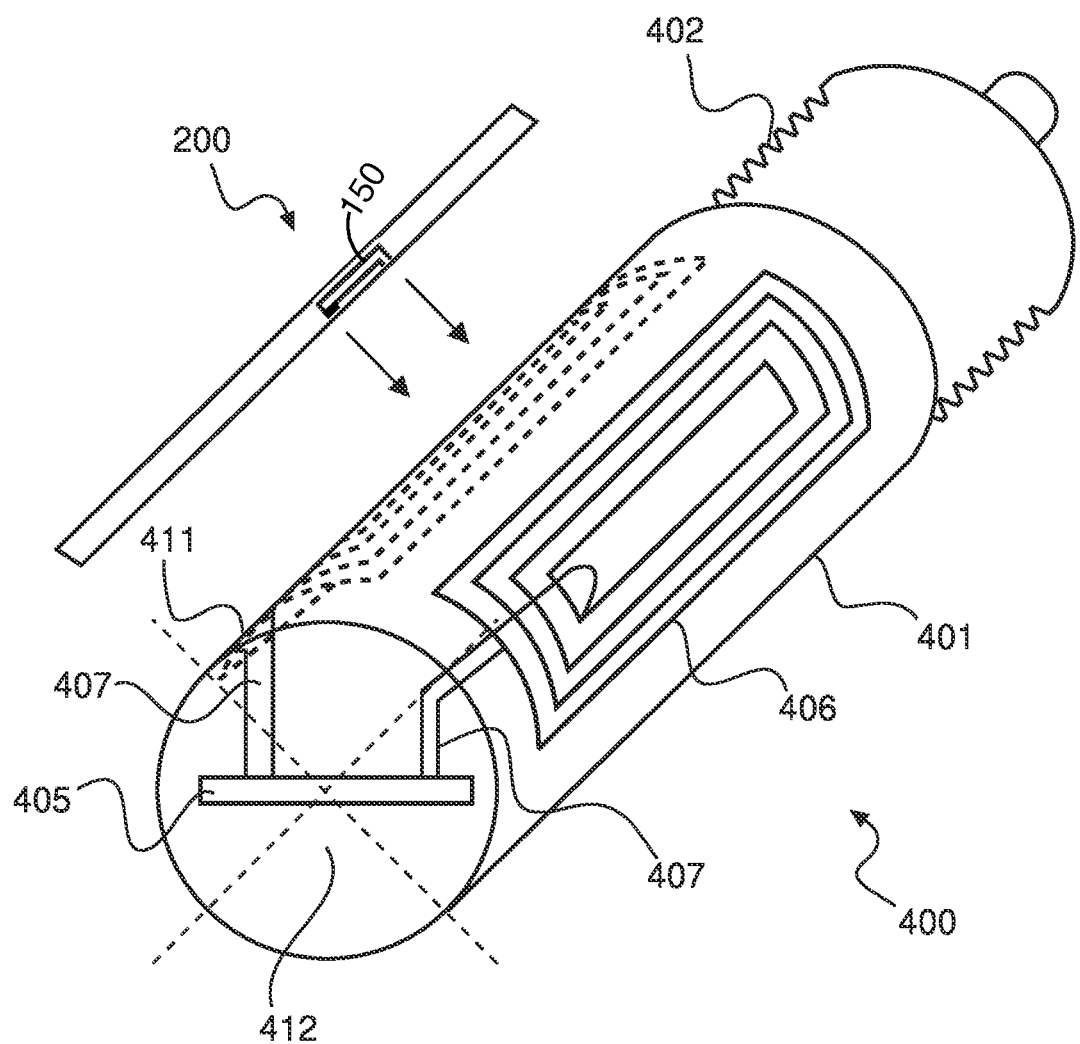
FIG. 3 shows a schematic view of a third preferred embodiment of a measuring device according to the present disclosure.

FIGS. 1a to 1d show several schematic views of a first preferred embodiment of a measuring device 100 according to the present disclosure, for example in the form of a radar sensor.

The measuring device 100 comprises a cylindrical housing section 101, which is preferably made of a non-metallic material, for example a plastic. The cylindrical housing section 101 may also be formed only partially from a non-metallic material, in particular at the points provided adjacent to the coil elements 106, 111, in order to enable inductive coupling at these points. The cylindrical housing section 101 is preferably followed by a threaded section 102 with which the measuring device 100 can be arranged at an installation site. The cylindrical housing section 101 contains a main board 105 with a first coil element 106 and a secondary board 110 with a second coil element 111.

The boards 105, 110 can be provided as RFID modules with one RFID chip each or, as shown in the particularly preferred embodiment, equipped with only one RFID chip 107. As can be seen in FIGS. 1*a*-1*d*, the boards 105, 110 are planar and are positioned in such a way that their surface normals point in different directions, namely in the particularly preferred embodiment shown, they are arranged at an angle of approximately 90° to each other. In comparison with the illustrations shown in FIGS. 1*a* and 1*b*, the measuring device 100 is shown in FIGS. 1*c* and 1*d* rotated by 90° about its longitudinal axis.

As indicated in FIGS. 1*a*-1*d*, an inductive coupling of a mobile operating device 200 having at least one coil element 150 with the measuring device 100 can be provided either by means of the first coil element 106 or by means of the second coil element 111, depending on the positioning on the circumference of the measuring device 100. An inductive coupling and thus a communication is, thus, possible at any point along the circumference of the cylindrical housing section 101, so that the reliability of the data exchange can be considerably improved. In particular, this can prevent an operator from having to make several attempts to establish an inductive coupling between the measuring device 100 and the mobile operating device 200.

FIGS. 2*a*-2*b* shows two schematic views of a second preferred embodiment of a measuring device 300 according to the present disclosure. The measuring device 300 again comprises a cylindrical housing section 301 and a threaded section 302. Furthermore, the measuring device 300 in this embodiment comprises a main board 305 comprising an RFID chip and a coil element 306, here in the form of a foil element 306, which is connected to the main board 305 by means of connecting leads and/or contact pins 307. The coil element 306 is thereby arranged on an inner surface of the cylindrical housing section 301 and therefore has the form of a partial cylinder shell surface.

In the particularly preferred embodiment shown, the coil element 306 extends over more than half of the cylindrical inner surface of the cylindrical housing section 301. The coil element 306 can, for example, be glued as a separate element into the cylindrical housing section 301 or, for example, can be inserted by printing metallic tracks. Furthermore, it is possible to arrange the coil element 306 integrally in the wall of the cylindrical housing section 301, for example by a 2-component injection molding process. Alternatively, it is also possible to arrange the coil element 306 on the outside of the cylindrical housing section 301, for example by adhesive bonding.

As an alternative to the use of a non-conductive material for the cylindrical housing section 301, it is also possible to provide the side of coil element 306 facing the cylindrical housing section 301 with a magnetically conductive material, so that inductive coupling can in principle also be enabled when using a completely metallic housing.

FIG. 3 shows a schematic view of a third preferred embodiment of a measuring device 400 according to the present disclosure, comprising a cylindrical housing section 401 and a threaded section 402. In the cylindrical housing section 401, two coil elements 406, 411 are arranged in this embodiment, which are arranged at different positions on the inner surface of the cylindrical housing section 401. The coil elements of the 406, 411 are in turn connected by means of connecting leads and/or contact pins 407 to a main board 405, which comprises at least one RFID chip. The measuring device 400 shown in FIG. 3 also includes a lid element 412 with which the housing can be sealed against the environment and in which a coil element can also be arranged.

However, the present disclosure is not limited to the above preferred embodiments as long as it is covered by the subject matter of the following claims. In particular, different coil elements or different combinations of coil elements may be provided on a measuring device, for example in the form of independent RFID/NFC printed circuit board modules, separate foil elements, coil elements arranged integrally in a housing wall, whereby the coil elements can be arranged/placed in or on a housing in different ways, for example by means of adhesive bonding, printing or the like.

REFERENCE LIST

100 first preferred embodiment of a measuring device
101 cylindrical housing section
102 thread section
105 main board
106 first coil element
107 RFID chip
110 secondary board
111 second coil element
200 mobile operating device
300 second preferred embodiment of a measuring device
301 cylindrical housing section
302 thread section
305 main board
306 coil element
307 connection cables/contact pins
400 third preferred embodiment of a measuring device
401 cylindrical housing section
402 thread section
405 main board
406 first coil element
407 connection cables/contact pins
411 second coil element
412 lid element

The invention claimed is:

1. A measuring device for detecting a parameter, comprising:
    at least one communication device configured to conduct a wireless short-range communication with a mobile operating device,
    wherein the communication device includes at least one two-dimensionally formed first coil element configured to be electromagnetically coupled to at least one second coil element of the operating device; and
    wherein at least two regions are provided on (a) a single coil element of the at least one first coil element or (b) different coil elements of the at least one first coils element which have different normal vectors.

2. The measuring device according to claim 1, further comprising:
    a housing with at least one cylindrical portion,
    wherein the at least one first coil element is arranged on or in the at least one cylindrical portion.

3. The measuring device according to claim 1, wherein the at least one first coil element is arranged on a separate printed circuit board element.

4. The measuring device according to claim 1, wherein the at least one first coil element is provided as a separate component and electrically connected to a printed circuit board element.

5. The measuring device according to claim 1, wherein two of the at least one first coil element are provided as separate components and connected to a printed circuit board element.

6. The measuring device according to claim 1, wherein the communication device includes two first coil elements of the at least one first coil element, each of the two first coil elements being arranged in one plane and whose normal vectors are arranged at an angle between 15° and 165°.

7. The measuring device according to claim 1, wherein the communication device includes two first coil elements of the at least one first coil element, each of the two first coil elements being arranged in one plane and whose normal vectors are arranged at an angle between 45° and 135°.

8. The measuring device according to claim 1, wherein the communication device includes two first coil elements of the at least one first coil element, each of the two first coil elements being arranged in one plane and whose normal vectors are arranged at an angle of 90° to each other.

9. The measuring device according to claim 1, wherein the communication device includes two first coil elements of the at least one first coil element, each of the two first coil elements being arranged in one plane and whose normal vectors are arranged at an angle between 15° and 165° and wherein the two first coil elements are arranged on separate circuit board elements.

10. The measuring device according to claim 1, wherein the communication device includes at least one of the at least one first coil element having a curved surface.

11. The measuring device according to claim 10, wherein the curved surface corresponds to a partial surface of a cylinder mantle surface.

12. The measuring device according to claim 1, wherein the communication device includes at least two of the at least one first coil element with curved surfaces.

13. The measuring device according to claim 12, wherein, each of the curved surfaces corresponds to a partial surface of a cylinder mantle surface.

14. The measuring device according to claim 1, wherein the at least one first coil element is formed as a foil element.

15. The measuring device according to claim 2, wherein the at least one first coil element is formed as a foil element and arranged on an inner or outer surface of the housing.

16. The measuring device according to claim 2, wherein the at least one first coil element is formed as a foil element and glued on an inner or outer surface of the housing.

17. The measuring device according to claim 2, wherein the at least one first coil element is at least partially printed on an inner or outer surface of the housing.

18. The measuring device according to claim 2, wherein the at least one coil first element is integrally incorporated within a wall of the housing.

19. The measuring device according to claim 18, wherein the wall is formed at least partially from a non-metallic material.

20. The measuring device according to claim 18, wherein the wall is formed at least partially from a plastic material.

21. The measuring device according to claim 1, further comprising:
a lid element,
wherein the at least one first coil element is arranged on or in the lid element.

22. The measuring device according to claim 2, wherein the at least one first coil element electrically contacts a printed circuit board element arranged in the housing and at least partially encloses it.

23. The measuring device according to claim 2, wherein the housing has at least one area which is formed from a non-metallic material and wherein the at least one first coil element is arranged on or in the at least one area.

24. The measuring device according to claim 2, wherein the housing has at least one area which is formed from a plastic material and wherein the at least one first coil element is arranged on or in the at least one area.

25. The measuring device according to claim 1, wherein the communication device includes an RFID interface and/or an NFC interface.

26. A system for detecting a parameter to be measured, comprising:
at least one mobile operating device; and
at least one measuring device including at least one communication device configured to conduct a wireless short-range communication with the operating device,
wherein the communication device includes at least one two-dimensionally formed first coil element configured to be electromagnetically coupled to at least one second coil element of the operating device; and
wherein at least two regions are provided on (a) a single coil element of the at least one first coil element or (b) different coil elements of the at least one first coils element which have different normal vectors.

* * * * *